(12) United States Patent
Pierco et al.

(10) Patent No.: US 8,873,210 B2
(45) Date of Patent: Oct. 28, 2014

(54) ESD PROTECTION DEVICE WITH REDUCED CLAMPING VOLTAGE

(75) Inventors: Ramses Pierco, Ypres (BE); Johan Bauwelinck, Temse (BE); Xin Yin, Ghent (BE)

(73) Assignees: IMEC VZW, Leuven (BE); Universiteit Gent, Ghent (BE)

( * ) Notice: Subject to any disclaimer, the term of this patent is extended or adjusted under 35 U.S.C. 154(b) by 0 days.

(21) Appl. No.: 13/607,959

(22) Filed: Sep. 10, 2012

(65) Prior Publication Data

US 2013/0063846 A1    Mar. 14, 2013

(30) Foreign Application Priority Data

Sep. 9, 2011  (EP) ..................... 11180790

(51) Int. Cl.
*H02H 3/22* (2006.01)
*H02H 9/04* (2006.01)
*H01L 27/02* (2006.01)

(52) U.S. Cl.
CPC ........... *H01L 27/0259* (2013.01); *H02H 9/046* (2013.01)
USPC ............................ 361/56; 361/111

(58) Field of Classification Search
USPC .................................... 361/56, 111
See application file for complete search history.

(56) References Cited

U.S. PATENT DOCUMENTS

| | | | |
|---|---|---|---|
| 6,600,356 B1* | 7/2003 | Weiss | 327/310 |
| 2004/0057172 A1* | 3/2004 | Sun | 361/56 |
| 2005/0083618 A1* | 4/2005 | Steinhoff et al. | 361/56 |

* cited by examiner

*Primary Examiner* — Danny Nguyen
(74) *Attorney, Agent, or Firm* — McDonnell Boehnen Hulbert & Berghoff LLP

(57) ABSTRACT

Disclosed is an ESD protection circuit comprising a plurality of bipolar transistors, namely a plurality of ESD current conducting transistors (Q1, Q2, Q4) in a main ESD current conducting path between a first and a second terminal (T1, T2), and further comprises at least one driving transistor (Q3) connected in parallel to at least one of the ESD current conducting transistors (Q1) and provided for conducting a driving current (Ib2) to one or more of the ESD current conducting transistors (Q3) on occurrence of an ESD event.

12 Claims, 6 Drawing Sheets

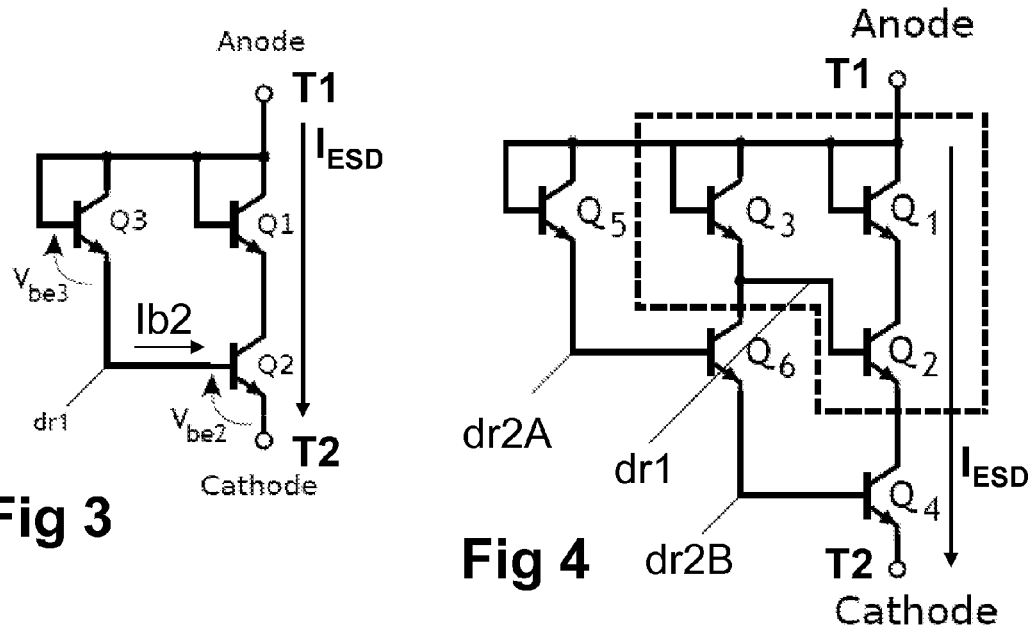
Fig 3
Fig 4
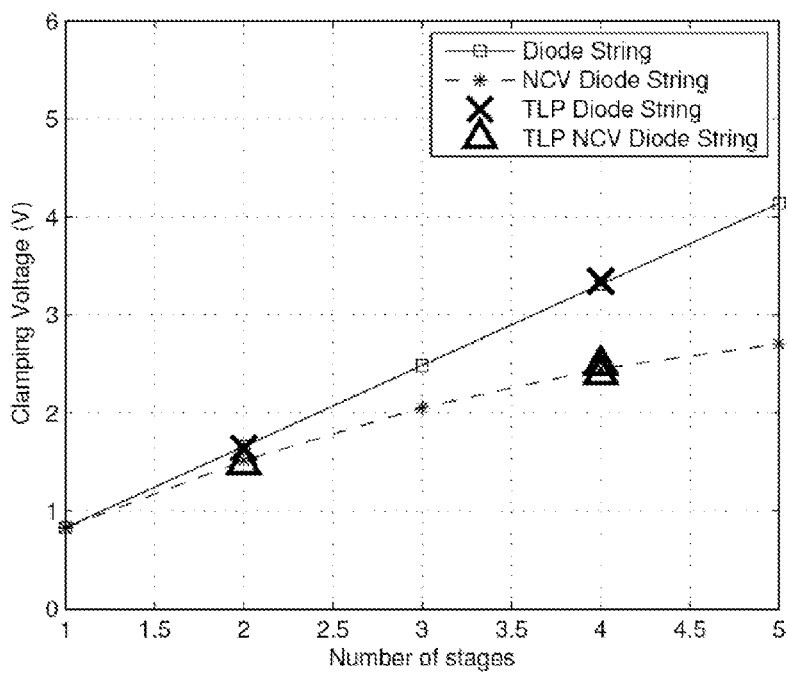
Fig 5

ESD PROTECTION DEVICE WITH REDUCED CLAMPING VOLTAGE

CROSS REFERENCE TO RELATED APPLICATIONS

Pursuant to the provisions of 35 U.S.C. §119(b), this application claims priority to EP11180790.5 filed Sep. 9, 2011, the entire contents of which are incorporated herein by reference.

FIELD

The invention relates to an ESD protection circuit, in particular to an on-chip ESD protection circuit for integrated electronic circuits. The circuit may be used as ESD diode or as ESD power clamp.

BACKGROUND

It is well known that multiple forward biased diodes can be stacked in series as electrostatic discharge (ESD) protection circuit in view of the low parasitic capacitance of the series connection of diode capacitances.

In BiCMOS technology this series connection of diodes can also be implemented by means of bipolar transistors, which also leads to a low leakage current. However, with a number of N bipolar transistors in series, whereby the base-emitter junction of each bipolar transistor is used as diode, the clamping voltage over the diode chain is increased to N times the built-in junction voltage Vbe(on) of a base-emitter junction. For advanced technologies (such as 130 nm SiGe BiCMOS) this clamping voltage N×Vbe(on) is too high because of the low collector-emitter breakdown voltage of the bipolar transistors and the possibly low oxide breakdown voltage of the gate dielectric of the MOSFETS in the circuitry to be protected by this diode-chain.

SUMMARY

It is an aim of this invention to provide an ESD protection circuit with which a lower clamping voltage can be achieved without adversely affecting the parasitic capacitance.

According to the present invention, the aforementioned aim is achieved with the ESD protection circuit having the technical characteristics of the first claim.

Thereto, the ESD protection circuit of the invention comprises a plurality of bipolar junction transistors, namely a plurality of, in particular at least three, ESD current conducting transistors in a main ESD current conducting path between a first and a second terminal, and further comprises a driving circuit having at least one driving transistor provided for conducting a driving current to the bases of at least two of the ESD current conducting transistors, in particular the downstream ESD current conducting transistors, on occurrence of an ESD event.

As used herein, "upstream" and "downstream" define an order in the flow path in the direction of flow of the ESD current.

When an ESD event occurs (or is simulated over) the first and second terminals of the circuit, the driving transistor(s) supply a driving current to the base(s) ESD current conducting transistor(s) which are connected thereto. This triggers these ESD current conducting transistors, so that the ESD current $I_{ESD}$ can flow through their collector-emitter junction. In the wording "ESD current conducting transistors" is implied that these transistors are adapted to be able to sustain ESD currents. In particular, these transistors are adapted to conduct ESD currents while in saturation, so that their on-resistance is low.

As the base current for the bipolar junction transistor(s) in the main ESD current path (i.e., those which are connected to the at least one driving transistor) is only a fraction of the ESD current $I_{ESD}$, the base-emitter voltage of each driving transistor is much smaller than the base-emitter voltage of an ESD current conducting transistor which conducts the full ESD current $I_{ESD}$. Since the base-emitter current paths of the driving transistor(s) are in parallel over one or more of the ESD current conducting transistor(s), the total voltage over the terminals can be significantly reduced.

In addition, the capacitance of the circuit according to the invention may also be lower as compared to a conventional diode-string, even for a circuit with the same total circuit area as the diode-string, while the ESD stress level (e.g., TLP failure current level) of the circuit of the invention is substantially the same as for the diode-string. It is clear to the person skilled in the art that the lower capacitance of the ESD protection is highly advantageous in RF devices.

When the proposed structure is used as a power clamp, the leakage current for which the substrate leakage current is a dominant part of the total leakage current, will be lower. Also the leakage current in function of the voltage shows a steeper curve. This results in a device with a lower leakage current at the same absolute voltage below the clamping voltage.

In an embodiment of an ESD protection circuit according to the invention, the plurality of ESD current conducting transistors comprises a first bipolar junction transistor having its base and collector connected to the first terminal and a second bipolar junction transistor having its collector connected to the emitter of the first bipolar junction transistor; and the group of driving transistors comprises a third bipolar junction transistor having its base and collector connected to the first terminal and its emitter connected to the base of the second bipolar junction transistor.

In an embodiment of an ESD protection circuit according to the invention, the plurality of ESD current conducting transistors further comprises a fourth bipolar junction transistor having its collector connected to the emitter of the second bipolar junction transistor; and the group of driving transistors further comprises a fifth and a sixth bipolar junction transistor, the fifth bipolar junction transistor having its base and collector connected to the first terminal and having its emitter connected to the base of the sixth bipolar junction transistor, the collector of the sixth bipolar junction transistor being connected to the emitter of the third bipolar junction transistor and the emitter of the sixth bipolar junction transistor being connected to the base of the fourth bipolar junction transistor.

In embodiments according to the present invention, the ESD current conducting transistors are sized for conducting the ESD current $I_{ESD}$, whereas the driving transistor(s) is/are sized for conducting only the driving current, i.e., the driving transistor(s) can be much smaller than the ESD current conducting transistors, e.g., half the area or smaller. The driving transistor(s) in the circuit of the present invention only need to deliver the base current for the ESD current conducting transistor(s), and do not need to be able to sustain the full ESD current $I_{ESD}$ as they are parallel over part of the main ESD current conducting path. Reducing the size also reduces the capacity of the driving transistor, but slightly increases the base to emitter voltage together with a drop in the sustainable current and subsequent ESD-level. The skilled person can thus find a suitable trade-off between a lower clamp voltage and a higher ESD-protection level versus a lower capacitance.

In preferred embodiments according to the invention, the circuit comprises an upstream row connected to the first terminal, in which row the bipolar junction transistors—an ESD current conducting transistor or driving transistor—are configured as diodes for limiting leakage currents.

The ESD protection circuit of the invention can be used as one of the ESD double diodes between an input/output terminal and a source voltage terminal of the electronic circuit it needs to protect. For this use, an ESD-device with a low capacitance together with a low clamping voltage and high ESD-robustness are preferred, which is achievable by means of the ESD protection circuit of the invention.

The ESD protection circuit of the invention can also be used as ESD power clamp between the source voltage terminals (VDD, VSS) of the electronic circuit it needs to protect. For this use, a low leakage current together with a high sustainable ESD-level are preferred, which is achievable with the ESD protection circuit of the invention.

In alternative embodiments still according to the invention, as an alternative to all embodiments described herein, the first ESD current conducting transistor, i.e., the one in the upstream row of which the base and collector are connected to the same terminal and which is configured as a diode, can also be replaced by an actual diode, i.e., a simple pn-junction. Hence, the invention also encompasses an ESD protection circuit having in its main ESD current conducting path this diode followed by one or more of the ESD current conducting bipolar junction transistors, and at least one driving bipolar junction transistor in parallel for supplying a driving current to the base of one or more of the ESD current conducting bipolar junction transistors.

BRIEF DESCRIPTION OF THE DRAWINGS

The invention will be further elucidated by means of the following description and the appended drawings.

FIG. 3 shows a comparative example of an ESD protection circuit, comprising three transistors.

FIG. 4 shows an embodiment of an ESD protection circuit according to the present invention, comprising six transistors.

FIG. 5 shows a graph with the clamping voltage of a classical diode-string and of preferred embodiments of the circuit according to the present invention.

DETAILED DESCRIPTION

Figure 1:
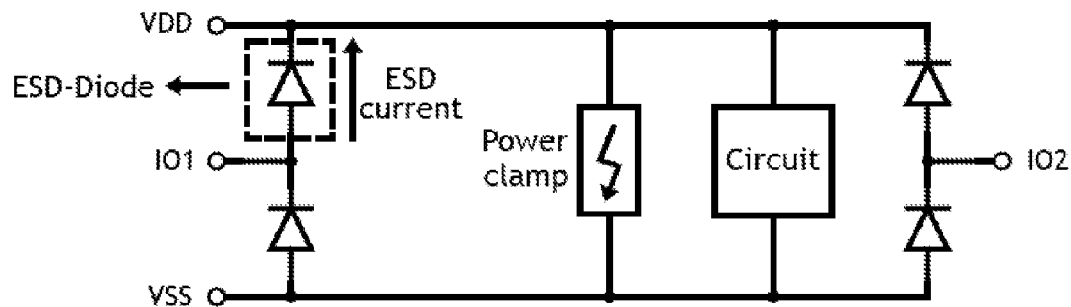
FIG. 1 shows a typical ESD-protection configuration with in- or outputs and ground and supply power rails.

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not necessarily correspond to actual reductions to practice of the invention.

Furthermore, the terms first, second, third and the like in the description and in the claims, are used for distinguishing between similar elements and not necessarily for describing a sequential or chronological order. The terms are interchangeable under appropriate circumstances and the embodiments of the invention can operate in other sequences than described or illustrated herein.

Moreover, the terms top, bottom, over, under and the like in the description and the claims are used for descriptive purposes and not necessarily for describing relative positions. The terms so used are interchangeable under appropriate circumstances and the embodiments of the invention described herein can operate in other orientations than described or illustrated herein.

The term "comprising" used in the claims, should not be interpreted as being restricted to the means listed thereafter; it does not exclude other elements or steps. It needs to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

The description below relates to ESD protection circuits according to embodiments of the invention, in particular to an on-chip ESD protection circuit for integrated RF devices implemented in SiGe BiCMOS technology of 250 nm and beyond, because in this technology the collector-emitter breakdown voltage is relatively low. But the ESD protection circuit may also be used in other technologies which comprise bipolar transistors.

FIG. 1 shows a schematical ESD-protection configuration for protecting in- or outputs, and/or ground and supply rails of an electronic device. It has "ESD diodes", shows as diodes in reverse mode (i.e., non-conducting mode) as ESD protection between the I/O terminals IO1, IO2, and the source voltage terminals VDD, VSS. It further has an "ESD power clamp" between the source voltage terminals VDD and VSS.

Figure 2:
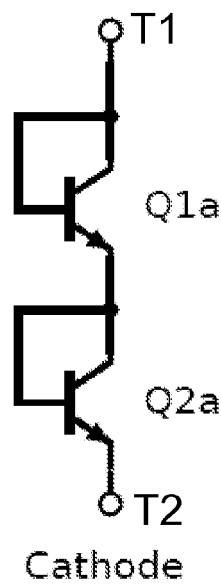
FIG. 2 shows a conventional diode string with two bipolar junction transistors configured as diodes, known in the art.

For RF applications that need an ESD protection circuit with a lower clamping voltage, traditionally a reverse biased diode-string with a number of (e.g., two or three or four or more) diodes connected in series is used. Instead of diodes also bipolar junction transistors (BJT) configured as diodes by connecting their collector and emitter, as shown in FIG. 2, may be used. By increasing the number N of stacked diodes (or transistors configured as diodes), the clamping voltage of the circuit can be increased in steps of Vbe(on). The value for Vbe(on) depends on the technology, and may, e.g., be a value in the range of 0.85-0.90V in 130 nm BiCMOS technology. However, this diode-string has a certain capacitance, which should be as low as possible for high frequency circuits. Lowering the capacitance can be achieved by increasing the number of N, but has the disadvantage that the clamp voltage also increases linearly with the number N.

FIG. 3 shows comparative example of an ESD circuit consisting of three transistors, as an alternative for the conventional diode-string with two diodes (FIG. 2). The ESD protection circuit consists of a first, second, and third bipolar junction transistor Q1, Q2, Q3, whereby the first and second transistor Q1, Q2 are connected in series between the first and second terminal T1, T2 for forming the main ESD current path, whereby the collector of the first transistor Q1 is connected to the first terminal T1, the emitter of the first transistor Q1 is connected to the collector of the second transistor Q2, and the emitter of the second transistor Q2 is connected to the second terminal T2; the transistors in the upstream row, in this case the first and third transistor Q1, Q3 are connected with their collector and their base to the first terminal T1 and functioning as diodes which limit the substrate leakage current of the ESD protection circuit; the emitter of the third transistor Q3 is connected to the base of the second transistor Q2 via a first drive connection dr1, for providing the base current Ib2 of the third transistor Q3. The second transistor Q2 functions as a switch between the terminals T1, T2, and the third transistor Q3 forms the drive circuit for controlling the switch.

The base current for the switch (second transistor) Q2 is provided by the third transistor Q3 in a diode configuration, and located in parallel to the main ESD path formed by Q1 and Q2. Because this base current is typically an order of magnitude smaller than the ESD current $I_{ESD}$ (by the well known factor $\beta_F$), the base-emitter voltage Vbe3 of the third transistor Q3 is lowered, and thus the total clamping voltage between the terminals T1, T2 is also lowered as compared to a conventional diode string with two diodes (FIG. 2).

The transistors in the main ESD current path Q1, Q2 are stacked, i.e., the emitter of one transistor Q1 is connected to the collector of the next transistor Q2. This leads to a low parasitic capacitance, which is beneficial for high-frequency circuits. In this way, an ESD circuit is created with the advantage of the diode string (low capacitance), but with a lower clamping voltage.

Note that the ESD protection circuit of embodiments of the present invention can consist solely of transistors, without the need for any resistor or capacitor (apart from the parasitic resistors or capacitors). This can lead to a smaller layout area in comparison to ESD-devices using resistors and capacitors (with typically high values).

When comparing the circuit of FIG. 3 to the classical diode-string with two diodes (FIG. 2), it can be seen that the downstream transistor Q2 is not used as a diode but as a normal transistor (thus with a large value for $\beta_F$). To drive a current into the base of this bipolar transistor Q2, another bipolar transistor Q3, used as diode, in parallel to the main ESD path, is used. As the current through this diode is smaller than the ESD current $I_{ESD}$ through the main ESD path, its voltage Vb is also reduced, and thus the total clamping voltage of the circuit is also reduced with respect to the circuit with two diodes.

A quantitative explanation for the lower clamping voltage can be given by means of the Ebers-Moll equations. Referring to FIG. 2, the ESD current I through the conventional prior art diode string equals the emitter current of both Q1a and Q2a and is given by:

$$I = -I_E(q1a) = -I_E(q2a)$$

Ebers—Mollequations:

$$I_E(Q2a) = -I_{ES} \cdot \left(e^{\frac{V_{BE}(q2a)}{V_T}} - 1\right) + \alpha_R \cdot I_{CS} \cdot \left(e^{\frac{V_{BC}(q2a)}{V_T}} - 1\right)$$

With $V_{BC} = 0$ $$I = I_{ES} \cdot \left(e^{\frac{V_{BE}(q2a)}{V_T}} - 1\right)$$

For the circuit of FIG. 3, the ESD current I is approximately the collector current of transistor Q2:

$$I = I_C(q2) = -\beta_F \cdot I_E(q3)$$

Similar reasoning:

$$I = \beta_F \cdot I_{ES} \cdot \left(e^{\frac{V_{BE}(q3)}{V_T}} - 1\right)$$

For the same ESD current I, the base-emitter voltages of transistors Q2a and Q2 will be substantially the same. The difference in clamping voltage then equals:

$$\Delta V_{clamp} = V_{BE}(q1a) - V_{BE}(q3)$$

$$\Delta V_{clamp} = V_T \cdot \ln\left(\frac{I}{I_{ES}} - 1\right) - V_T \cdot \ln\left(\frac{I}{\beta_F \cdot I_{ES}} - 1\right)$$

$$\Delta V_{clamp} \approx V_T \cdot \left(\ln\left(\frac{I}{I_{ES}}\right) - \ln\left(\frac{I}{\beta_F \cdot I_{ES}}\right)\right) = V_T \cdot \ln(\beta_F)$$

FIG. 5 shows a graph comparing the clamping voltage for the classical diode-string and for the circuit of FIG. 3. Both simulations and measurements are plotted and show good agreement. From the graph it can be seen that the clamping voltage of the "2-stage" circuit of FIG. 3 is about 1.50V whereas the clamping voltage of the 2-stage diode-string of FIG. 2 is about 1.70V. This effect becomes even more pronounced for a circuit according to the present invention with 3 or 4 stages, which will be described further.

FIG. 4 shows a preferred embodiment of the circuit of the present invention corresponding to the "3-stage" diode-string. The circuit of FIG. 4 comprises six bipolar junction transistors. The transistors in the upstream row, namely the first, third and fifth transistor Q1, Q3, Q5 are configured as diodes for limiting substrate leakage-current. The first, second and fourth transistors Q1, Q2, Q4 are stacked to form the main ESD current path, whereby the second and fourth transistor Q2, Q4 function as two switches in series. These switches are controlled either directly or indirectly by the "diodes" Q3, Q5 that are not part of the main ESD current path. In particular, the switch formed by the second transistor Q2 is (directly) controlled by the third transistor Q3 configured as diode via the first drive connection dr1, whereas the switch formed by the fourth transistor Q4 is (indirectly) controlled by the fifth transistor Q5 configured as diode via a second drive connection dr2A. The current to be delivered by the fifth transistor Q5 is further decreased by the sixth transistor Q6, which turns on/off the fourth transistor Q4 via a third drive connection dr2B. A similar formula for the difference in clamping voltage as for the 2-stage circuit can be derived for an N-stage circuit:

$$\Delta V_{clamp} = V_T \cdot \sum_{i=1}^{n-1} \ln(\beta_F^i)$$

From the graph in FIG. 5 it can be seen that the clamping voltage of the "3-stage" circuit of FIG. 4 is about 2.0V whereas the clamping voltage of the 3-stage diode-string is about 2.5V. This demonstrates the difference in clamping voltage with an increasing number of stages. At four stages (FIG. 16) the clamping voltage of the circuit of this invention is already lower than that of a conventional 3-stage diode string.

Figure 8:
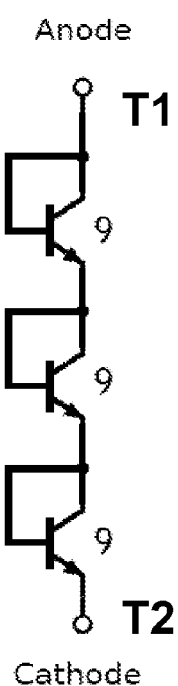
FIG. 8 shows an example of a conventional diode string with three diodes, with numbers indicating the relative area of each diode.
Figure 9:
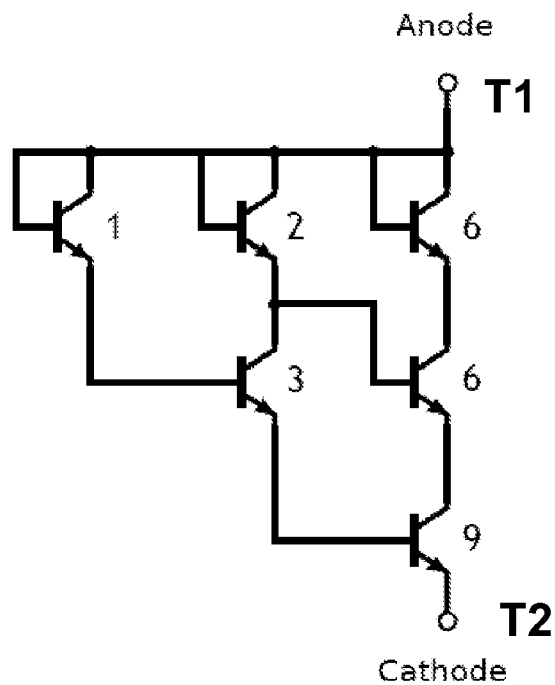
FIG. 9 shows an example of the circuit of FIG. 4 with numbers indicating the relative area of each transistor. The total area of this circuit is equal to that of FIG. 8.

FIG. 8 and FIG. 9 show the relative areas of the diodes and the transistors that were used for this comparison, but these relative areas are only an example, and the person skilled in the art may use other relative sizes. In this example, the total area of each horizontal row of transistors was chosen equal (1+2+6=3+6=9), thus the total area of the diode-string and the circuit of this embodiment of the present invention are equal.

Figure 7:
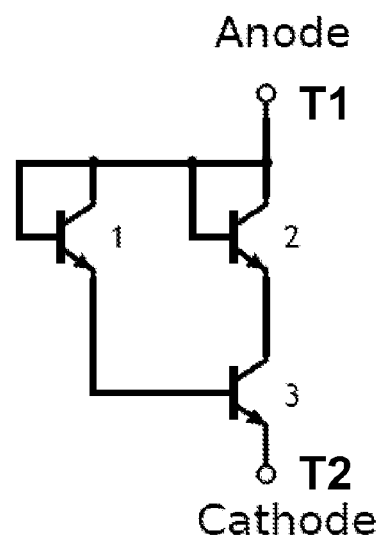
FIG. 7 shows an example of the circuit of FIG. 3 with numbers indicating the relative area of each transistor. The total area of this circuit is equal to that of FIG. 6.

Note that in FIG. 7 and FIG. 9, the size of the first transistor Q1 is also smaller than the size of the second transistor Q2, despite that the same ESD current $I_{ESD}$ will run through both. This has no negative effect on the behaviour of the circuit, because during the initial ESD current peak, a significant part of the current is conducted through the transistor Q3 and the base-emitter junction of Q2.

Figure 10:
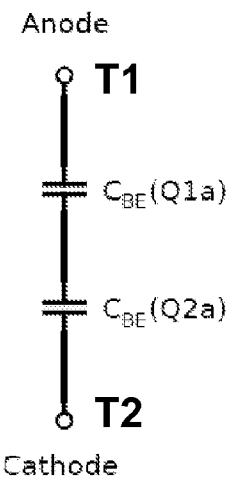
FIG. 10 shows the equivalent capacitances of the diode-string of FIG. 2.
Figure 11:
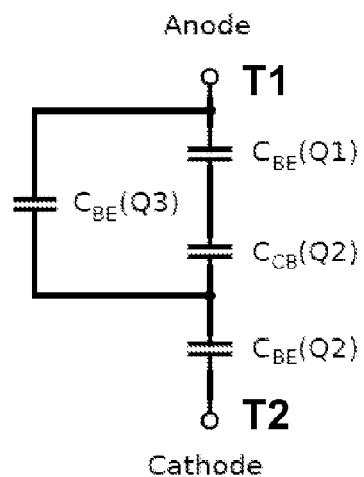
FIG. 11 shows the equivalent capacitances of the circuit of the present invention of FIG. 3.

To understand why the capacitance of circuits according to the invention can be made lower than that of a regular diode string, consider FIG. 10 and FIG. 11 showing the capacitance equivalent of the circuits of FIG. 2 and FIG. 3 respectively. The capacitances to the substrate are not considered. Since the capacitor $C_{CB}$(Q2) is typically very small with respect to $C_{BE}$(Q1), the total capacitance of the circuit in FIG. 11 can be approximated by the series configuration of capacitor $C_{BE}$(Q3) and $C_{BE}$(Q2). Since transistor q3 can be made a lot smaller (e.g., 2.0 or 3.0 times smaller) than Q2 (it has to conduct a much smaller current), its capacitance is lower and the series combination has a lower capacitance than that of the conventional diode string.

Figure 6:
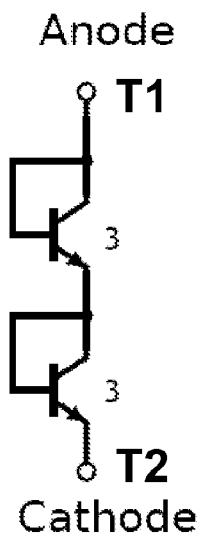
FIG. 6 shows an example of a conventional diode string with two diodes, with numbers indicating the relative area of each diode.
Figure 12:
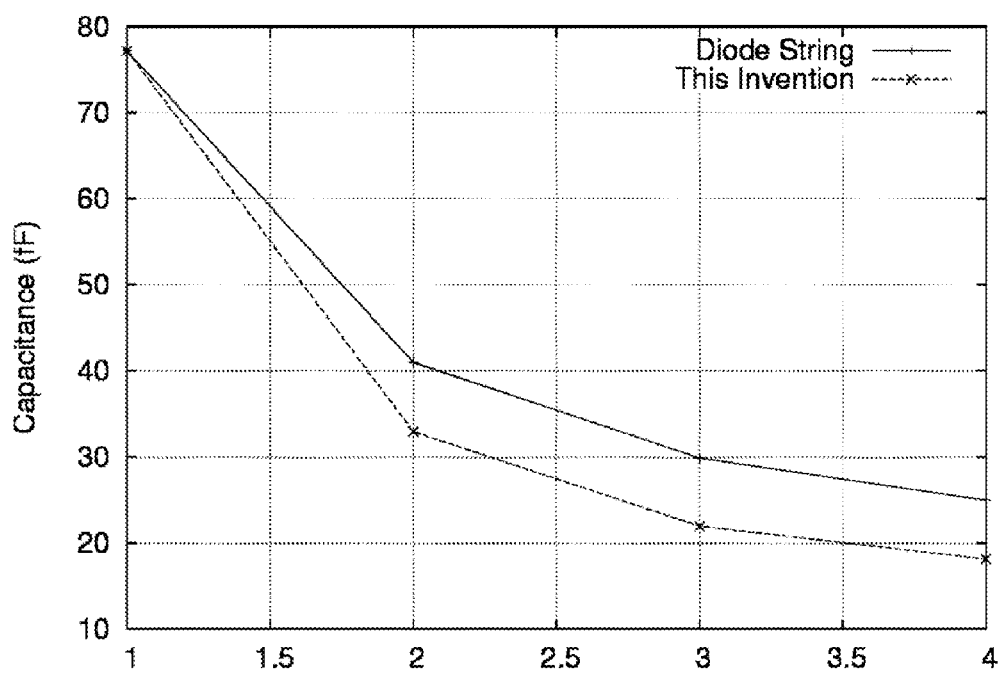
FIG. 12 shows a comparison between the capacitance of a conventional diode-string versus preferred embodiments of the circuit of the present invention.

FIG. 12 shows a comparison between the simulated capacitance of a conventional diode-string versus preferred embodiments of the circuit of the present invention using the relative areas indicated in FIGS. 8-11 for the 2-stage and 3-stage circuits respectively. From this graph it can be seen that the capacitance of the 2-stage diode-string (FIG. 6) is about 41 fF, as compared to 32 fF for the circuit of an embodiment of the present invention (FIG. 7). The resulting (simulated) capacitance of the "3-stage" diode-string (FIG. 8) is about 30 fF, which is reduced to about 22 fF for the "3-stage" circuit of an embodiment of the present invention (FIG. 9). Lowering the capacitance allows to increase the frequency and/or bandwith, which can be of prime importance in RF applications.

Combining FIG. 5 and FIG. 12 shows that the circuits of the present inventions can enable to decrease the capacitance and the clamping voltage at the same time. When a conventional diode-string with a lower capacitance is needed, "stages" need to be added, but the clamping voltage increases in a linear way. When stages are added to the circuits of the present invention, the capacitance is lowered, but the clamping voltage increases sub-linearly. This is very advantageous.

Note that the number of "stages" of preferred embodiments (FIG. 3, FIG. 4, FIG. 16) of the circuit of the present invention can be seen as the number of parallel transistors (horizontally), or as the number of stacked transistors (vertically). But the invention is not limited to these preferred embodiments. Several variations are possible.

Figure 13:
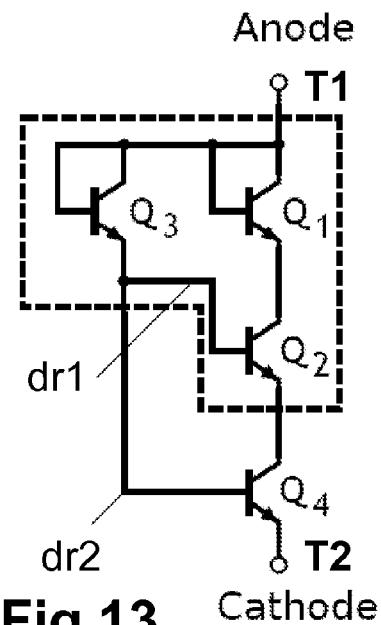
FIG. 13 shows an embodiment of the circuit of the present invention, having four transistors.

FIG. 13 shows an embodiment of the circuit of the present invention, having four transistors, herein referred to as "first variant." Structurally it can be seen as a variant of the first preferred embodiment with three transistors (FIG. 3) where a fourth transistor Q4 is added, or it can also be seen as a variant of the second preferred embodiment with six transistors (FIG. 4) wherein the fifth and sixth transistor Q5, Q6 are removed. The operation of this circuit is very similar to that of FIG. 3, but instead of one switch in the main ESD current path, there are two switches Q2, Q4 connected in series. Both switches need to be closed in order to allow ESD current $I_{ESD}$ to flow between the terminals T1, T2. The third transistor Q3 is configured to control both switches Q2, Q4.

Figure 15:
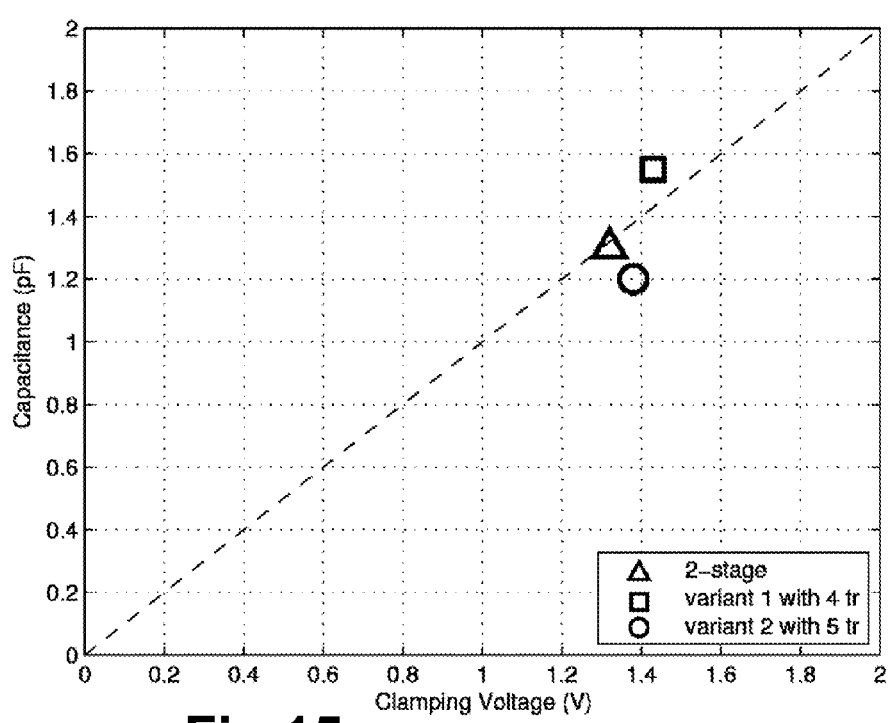
FIG. 15 shows a graph comparing the clamp voltage and capacitance of the circuits of FIGS. 9, 13 and 14.

FIG. 15 shows a graph comparing the clamping voltage and capacitance of the "first variant" circuit (FIG. 13) with the first preferred embodiment of the circuit of the present invention (FIG. 3), assuming the relative transistor-sizes of FIG. 9, but with a different circuit area. As could be expected, the clamping voltage is increased because of the extra collector-emitter saturation voltage, and the capacitance is also increased.

Figure 14:
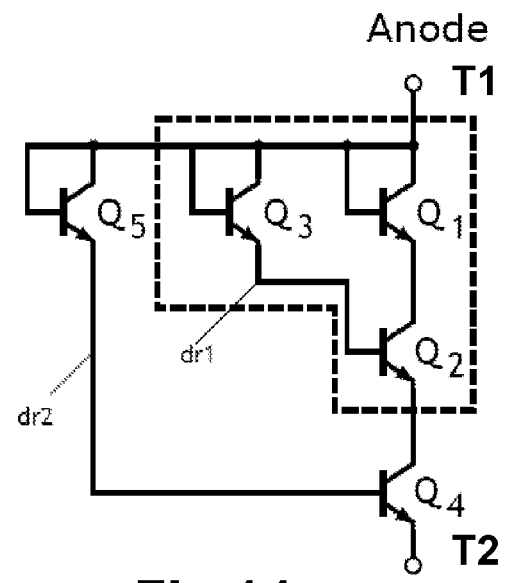
FIG. 14 shows another embodiment of the circuit of the present, having five transistors.

FIG. 14 shows another embodiment of the circuit of the present invention, having five transistors, herein referred to as "second variant." The fifth transistor Q5 is configured as a diode, for limiting leakage current, and its emitter is connected to the base of the fourth transistor Q4 for providing the base current for closing the switch Q4 during an ESD event.

Figure 16:
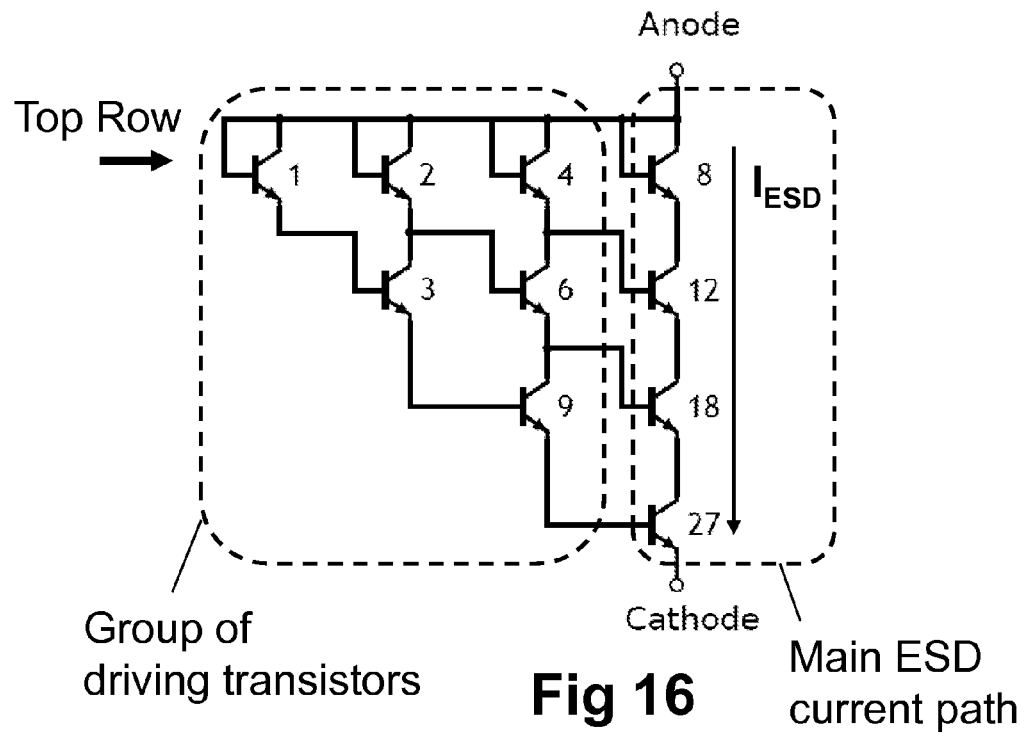
FIG. 16 shows a third preferred embodiment of the circuit of the present invention, consisting of ten transistors.

FIG. 16 shows a third preferred embodiment of the circuit of the present invention, having four stages. It comprises ten transistors. This circuit is proposed as an alternative for a conventional diode-string with four diodes, i.e., has four stages. The graph of FIG. 5 shows that the clamping voltage of this circuit is approximately 0.9V smaller than that of the four-stage diode-string, and FIG. 12 shows that the capacity is approximately 25% smaller than that of the four-stage diode-string, for a circuit with the same area.

Figure 17:
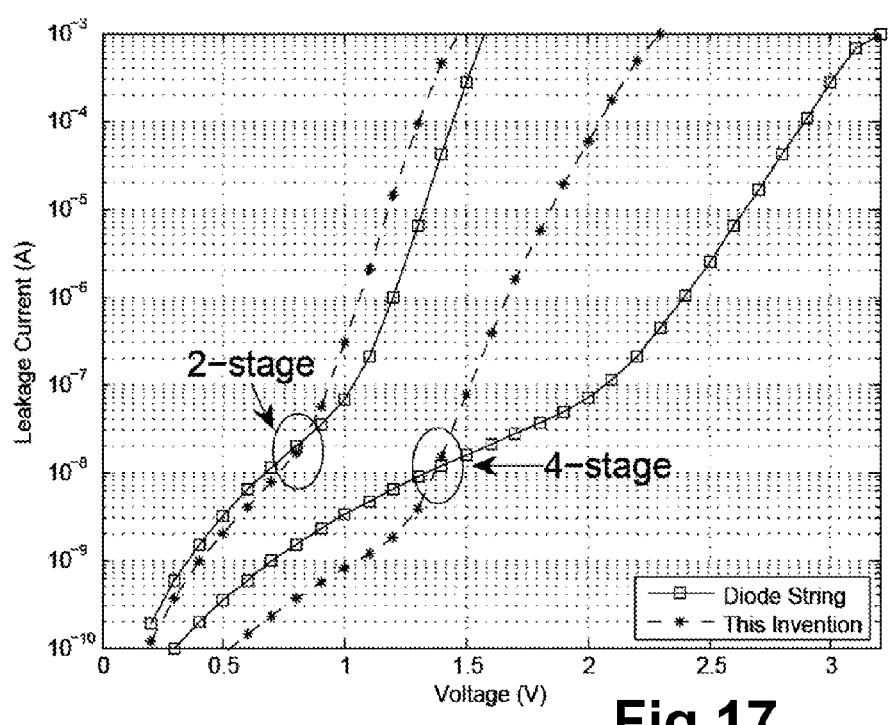
FIG. 17 shows the measured non-substrate leakage current for a 2-stage and a 4-stage version of the conventional diode-string and preferred embodiments of the circuits of the present invention.

FIG. 17 shows the measured non-substrate leakage current for a 2-stage and 4-stage version of a conventional diode string and preferred embodiments of the circuit of this invention. The area of the individual diodes in the 2-stage and 4-stage diode string are assumed the same. For the comparison, the total area of the circuit of the embodiments of the present invention is the same as that of the corresponding diode-string, but the circuit with 4 stages is twice as large as the circuit with 2 stages.

The circuit of the present invention can also be used as a power clamp. One of the main requirements for a power clamp is a low leakage current together with the possibility to sustain a high ESD level in a small silicon area. Since the bipolar transistors are used in their forward active area (no breakdown of a junction is occurring) this last requirement is fulfilled. The leakage current of the device can be divided in substrate and non-substrate leakage current. The substrate leakage is determined by the transistors connected to the anode. Since these have their base connected to the collector, the base-emitter voltage of the parasitic pnp transistor to substrate is zero. Thus, the circuit of the present invention has the same low substrate leakage current as a regular diode string in a BiCMOS process. The non-substrate leakage current is plotted in FIG. 17 versus voltage applied. This shows that before the device turns on, the leakage current is significantly lower for the circuit of the present invention as compared to the diode-string. For the 4-stage version this is almost one order of magnitude smaller. For these reasons (low substrate current and low inherent leakage current) the proposed ESD protection circuit also makes a good power clamp.

In order to show that the circuit of the present invention is able to sustain a similar level of ESD stress as a regular diode string, Table 1 shows the results for both transmission line pulse (TLP) and human body model (HBM) testing. Table 1 shows that similar ESD-levels are obtained for the conventional diode string and for the circuits of the present invention.

TABLE 1

|  | 2-stage diode string | 2-stage this invention | 4-stage diode string | 4-stage this invention |
| --- | --- | --- | --- | --- |
| TLP failure current level | 677 mA | 667 mA | 1.34 A | 1.38 A |
| HBM failure voltage level | 1.9 kV | 1.7 kV | 5.1 kV | 4.5 kV |

The bipolar transistor circuits described above can, thus, be used as an ESD protection device for protecting input nodes against ESD events, or can be used as a power clamp. In the latter case, the ESD circuit is inserted between the power supply line VDD and ground GND. The number of stages will in this case be chosen high enough to get a clamping voltage sufficiently higher than the supply voltage. The size is to be chosen according to the required ESD protection level.

The invention claimed is:

1. An electrostatic discharge (ESD) protection circuit connected between a first terminal and a second terminal of an electronic circuit and provided for protecting the electronic circuit against an ESD event, the ESD protection circuit comprising:
    an ESD current conducting path extending from the first terminal to the second terminal and comprising a plurality of ESD current conducting transistors, each having a base, a collector and an emitter, wherein the ESD current conducting transistors are connected in series and configured for conducting an ESD current on occurrence of an ESD event, and wherein the plurality of ESD current conducting transistors further comprises a first bipolar junction transistor having its base and collector connected to the first terminal and a second bipolar junction transistor having its collector connected to the emitter of the first bipolar junction transistor; and
    at least one driving transistor having a base, a collector and an emitter, wherein the at least one driving transistor is connected in parallel to at least one of the ESD current conducting transistors, wherein the at least one driving transistor comprises a third bipolar junction transistor having its base and collector connected to the first terminal and its emitter connected to the base of the second bipolar junction transistor, and wherein the at least one driving transistor is configured for conducting a driving current on occurrence of the ESD event.

2. The ESD protection circuit according to claim 1, wherein the second bipolar junction transistor has its emitter connected to the second terminal.

3. The ESD protection circuit according to claim 1, wherein the plurality of ESD current conducting transistors further comprises a fourth bipolar junction transistor having its collector connected to the emitter of the second bipolar junction transistor and its base connected to the emitter of the third bipolar junction transistor.

4. The ESD protection circuit according to claim 3, wherein the fourth bipolar junction transistor has its emitter connected to the second terminal.

5. The ESD protection circuit according to claim 1, wherein the plurality of ESD current conducting transistors further comprises a fourth bipolar junction transistor having its collector connected to the emitter of the second bipolar junction transistor; and the at least one driving transistor further comprises a fifth bipolar junction transistor, the fifth bipolar junction transistor having its base and collector connected to the first terminal and having its emitter connected to the base of the fourth bipolar junction transistor.

6. The ESD protection circuit according to claim 5, wherein the fourth bipolar junction transistor has its emitter connected to the second terminal.

7. The ESD protection circuit according to claim 1, wherein the plurality of ESD current conducting transistors further comprises a fourth bipolar junction transistor having its collector connected to the emitter of the second bipolar junction transistor; and the at least one driving transistor further comprises a fifth bipolar junction transistor and a sixth bipolar junction transistor, the fifth bipolar junction transistor having its base and collector connected to the first terminal and having its emitter connected to the base of the sixth bipolar junction transistor, the collector of the sixth bipolar junction transistor being connected to the emitter of the third bipolar junction transistor and the emitter of the sixth bipolar junction transistor being connected to the base of the fourth bipolar junction transistor.

8. The ESD protection circuit according to claim 7, wherein the fourth bipolar junction transistor has its emitter connected to the second terminal.

9. The ESD protection circuit according to claim 1, wherein an area of the plurality of ESD current conducting transistors is at least twice an area of the at least one driving transistor.

10. The ESD protection circuit according to claim 1, wherein the ESD protection circuit comprises an upstream row of transistors having their bases and collectors connected to the first terminal and configured as diodes.

11. The ESD protection circuit according to claim 1, wherein the ESD protection circuit operates as an ESD diode between an input/output terminal and a source voltage terminal of the electronic circuit.

12. The ESD protection circuit according to claim 1, wherein the ESD protection circuit operates as an ESD power clamp between source voltage terminals of the electronic circuit.

* * * * *